United States Patent [19]

Torii et al.

[11] 4,302,279

[45] Nov. 24, 1981

[54] PROCESS FOR PRODUCING FERRITE SINGLE CRYSTAL FOR HIGH FREQUENCY

[75] Inventors: Michihiro Torii, Hamamatsu; Hirohito Goto, Gyoda; Utsuo Kihara, Kosai, all of Japan

[73] Assignee: Fuji Electrochemical Co., Ltd., Tokyo, Japan

[21] Appl. No.: 165,287

[22] Filed: Jul. 2, 1980

[51] Int. Cl.$^3$ ............................................. C30B 29/16
[52] U.S. Cl. ........................ 156/616 R; 156/DIG. 74
[58] Field of Search .......................... 252/62.64, 62.56; 156/617 SP, 613, 624, 616 R, 615, DIG. 89, DIG. 74, DIG. 77, DIG. 100

[56] References Cited

U.S. PATENT DOCUMENTS 3,115,469 12/1963 Hamilton .................... 156/DIG. 74
4,057,458 11/1977 Maeda et al. ............... 156/DIG. 74

OTHER PUBLICATIONS

IEEE Transactions on Magnetics V Mag 5, No. 3, 9/69, 285–289.
Ferrites: Proceedings of the International Conf., 7/70 Japan, pp. 81–83.

*Primary Examiner*—Hiram Bernstein
*Attorney, Agent, or Firm*—Fleit & Jacobson

[57] ABSTRACT

A process for producing Ni-Mn-Zn ferrite single crystal for high frequency wherein a sample comprising 10–30 molar percent of NiO, 1.8–12 molar percent of MnO, 15–35 molar percent of ZnO and 49–53 molar percent of $Fe_2O_3$ is melted and subjected to growing into a crystal under an oxygen partial pressure of below about 100 $Kg/cm^2$.

4 Claims, 4 Drawing Figures

PROCESS FOR PRODUCING FERRITE SINGLE CRYSTAL FOR HIGH FREQUENCY

BACKGROUND OF THE INVENTION

The present invention relates to a process for producing a ferrite single crystal for high frequency.

Generally, Ni-Zn ferrite has magnetic properties superior to those of Mn-Zn ferrite in a high frequency region, for example, above 10 MH$_Z$. The reason is that the Ni-Zn ferrite has a higher crystal magnetic anisotropy constant and specific resistance.

In growing Ni-Zn ferrite single crystal by Bridgman's method under atmospheric pressure, a different phase is formed if Fe$_2$O$_3$ content is less than 55 molar %, whereby a mixed crystal thereof with a spinel phase is formed. This fact has been confirmed by X-ray analysis, etc. Therefore, for obtaining the pure spinel phase, Fe$_2$O$_3$ content must be more than 55 molar %. However, when Fe$_2$O$_3$ content is more than 50 molar %, magnetite (FeO.Fe$_2$O$_3$) is formed, specific resistance is reduced due to the presence of Fe$^{2+}$ and high frequency magnetic properties are degraded due to eddy current loss to make the same useless in a high frequency region.

Accordingly, for growing Ni-Zn single crystal, Fe$_2$O$_3$ content should be adjusted to around 50 molar % and the presence of Fe$^{2+}$ should be avoided. Consequently, the growing must be effected under a high oxygen partial pressure (at least 100 Kg/cm$^2$) in the prior art. This is unsuitable for mass production, though it is allowable in production on an experimental scale.

SUMMARY OF THE INVENTION

An object of the present invention is to provide a process for producing a ferrite single crystal for high frequency range of, for example, above about 10 MH$_Z$.

Another object of the present invention is to provide a process for producing a ferrite single crystal of the kind referred to, which has desired magnetic properties for use in the range of high frequency.

Another object of the present invention is to provide a process for producing a ferrite single crystal for high frequency range, which can be grown in an industrial scale without substantial labor or difficulty.

A further object of the present invention is to provide a process for producing a ferrite single crystal for high frequency which has magnetic properties at least equivalent to those of known Ni-Zn ferrite single crystal and which can be grown under a relatively low oxygen partial pressure.

The present invention has been attained on the basis of a finding that a ferrite single crystal of excellent magnetic properties can be grown under the condition of a low oxygen pressure by replacing a part of Ni of the ordinary Ni-Zn ferrite single crystal with Mn.

Briefly, according to the present invention, there is provided a process for producing Ni-Mn-Zn ferrite single crystal for high frequency wherein a sample having 10-30 molar % of NiO, 1.8-12 molar % of MnO, 15-35 molar % ZnO and 49-53 molar % of Fe$_2$O$_3$ is melted and grown into a crystal under an oxygen pressure of below about 100 Kg/cm$^2$.

Other objects and features of the present invention will become apparent from the following detailed description of the invention, which will be made with reference to the accompanying drawings.

DETAILED DESCRIPTION OF THE INVENTION

Figure 1:
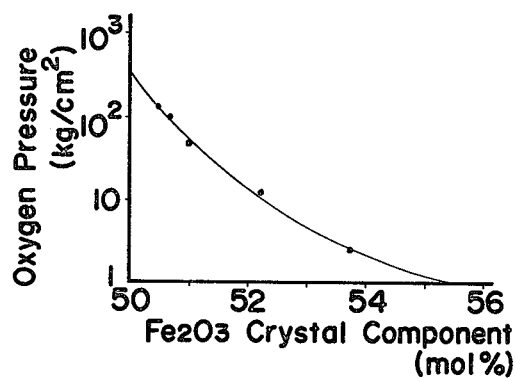
FIG. 1 is a diagram showing a relationship between Fe$_2$O$_3$ crystalline component and oxygen pressure.
Figure 2:
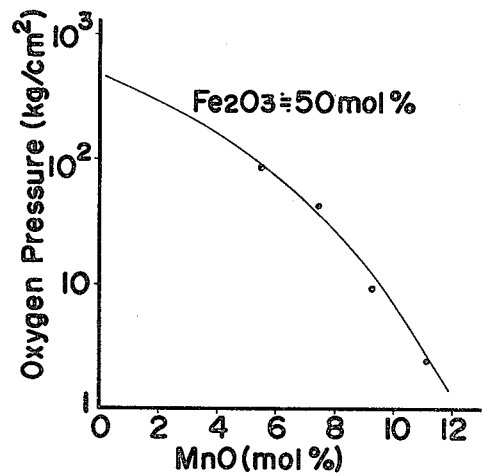
FIG. 2 is a diagram showing a relationship between amount of MnO used for the replacement and oxygen pressure.
Figure 3:
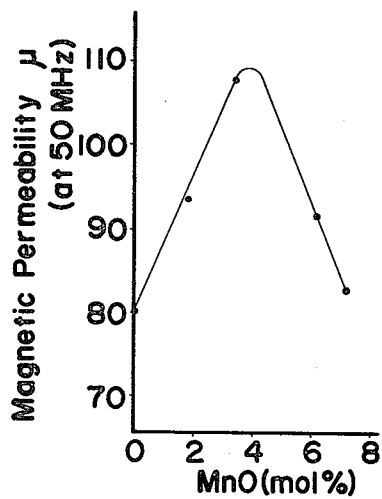
FIG. 3 is a diagram showing a relationship between amount of MnO used for the replacement and magnetic permeability at 50 MH$_Z$.

Referring first to FIGS. 1, 2 and 3 showing basic data for attaining the present invention, if the Fe$_2$O$_3$ content is adjusted to around 50 molar % in the formation of Ni-Zn ferrite single crystal for the above described reason, an oxygen pressure as high as several hundred Kg/cm$^2$ is necessitated as shown FIG. 1. However, if a part of NiO is replaced with Mno, the oxygen pressure required for maintaining a Fe$_2$O$_3$ content of around 50 molar % is reduced as the amount of the replacement is increased and finally, the growing becomes possible even under atmospheric pressure as shown in FIG. 2. FIG. 3 shows a relationship between amount of MnO used for the replacement and magnetic permeability $\mu$ at 50 MH$_Z$. It is apparent from Table 3 that magnetic permeability increases up to around 4 molar % as MnO used for the replacement is increased in amount but it is then decreased as MnO used for the replacement is increased further in amount. Specific resistance is enhanced as MnO used for the replacement is increased in amount, though not shown.

On the basis of these basic data, the present invention has been completed, wherein a sample comprising 10-30 molar % of NiO, 1.8-12 molar % of MnO, 15-35 molar % of ZnO and 49-53 molar % of Fe$_2$O$_3$ is melted and allowed to grow into a crystal under a low oxygen partial pressure. The crystal can be grown by any of Bridgman's method, a drawing-up method, floating zone method, Bernoullis' method, etc. The applicants herein employed Bridgman's method for obtaining basic data and in examples which will be given below, because the applicants have found that Bridgman's method which is considered to be suitable for mass production and oxygen partial pressure can be elevated easily is preferred, since stoichiometrical Ni-Zn ferrite growing is impossible unless the oxygen pressure is high. The reasons why NiO content is limited to 10-30 molar % are that if the NiO content is less than 10 molar %, MnO and ZnO are increased in amount and the specific resistance thereof is reduced and, in addition, high frequency magnetic properties are degraded, since crystal magnetic anisotropy constant K$_1$ is decreased. On the other hand, if NiO content is more than 30 molar %, crystal magnetic anisotropy constant K$_1$ becomes too high and, consequently, magnetic permeability at around 50 MH$_Z$ is reduced. If ZnO becomes excessive in amount, the saturation magnetic flux density is reduced. If Fe$_2$O$_3$ is beyond the range of 49-53 molar %, specific resistance of the crystal is reduced to a value below that of the spinel crystal structure, whereby magnetic properties thereof are degraded. Thus, the amounts of the components limited to those described above is an important condition of the present invention.

An embodiment of the present invention carried out according to Bridgman's method will be shown below in comparison with a case of MnO-free Ni-Zn ferrite. As known in the art, Bridgman's method comprises placing a crucible containing a melt in an electric furnace having a temperature gradient and moving the crucible relatively to the electric furnace, thereby forming the single crystal. Thirteen samples (200 g each) were prepared by mixing $Fe_2O_3$, NiO, ZnO and MnO powders of purities of higher than 99.9% in given ratios as shown in Table 1. Sample M-1 was free of NiO. Five samples N-1 through N-5 were free of MnO. Seven samples N-6 through N-12 contained MnO. About 200 g of each sample was sintered provisionally at 1000° C. for two hours in air. The sample powders thus treated were kneaded, dried sufficiently and shaped into tablets under a pressure of 1 ton/cm² and the tablets were sintered at 1200° C. for two hours in air to obtain the materials of single crystal.

TABLE 1

| Samples | Composition (Molar %) | | | |
|---|---|---|---|---|
| | $Fe_2O_3$ | NiO | ZnO | MnO |
| M - 1 | 50 | — | 27 | 23 |
| N - 1 | 51 | 24 | 25 | — |
| N - 2 | 50 | 25 | 25 | — |
| N - 3 | 49 | 25 | 26 | — |
| N - 4 | 48 | 25 | 27 | — |
| N - 5 | 47 | 25 | 28 | — |
| N - 6 | 49 | 23 | 26 | 2 |
| N - 7 | 49 | 21 | 26 | 4 |
| N - 8 | 49 | 19 | 26 | 6 |
| N - 9 | 49 | 17 | 26 | 8 |
| N - 10 | 49 | 13 | 26 | 12 |
| N - 11 | 49 | 11 | 26 | 14 |
| N - 12 | 49 | 9 | 26 | 16 |

The materials were charged in platinum-rhodium crucibles and melted in a high pressure Tammann furnace to grow crystals. Growing conditions were as shown in Table 2.

TABLE 2

| Growing conditions | |
|---|---|
| Growing temperature | 1690–1720° C. |
| Growing rate | Less than 2 mm/hr. |
| Growing length | 90 mm |
| Crucible diameter | 15 mmφ |

The compositions shown in Table 1 were allowed to grow into 19 single crystals in total under the above described growing conditions while the oxygen partial pressure was varied. Compositions of the crystals thus obtained as well as specific resistances and magnetic permeabilities at 50 MHz thereof were measured.

The results are shown in Table 3.

TABLE 3

| Samples | Oxygen partial pressure (Kg/cm²) | Composition (molar %) | | | | Specific resistance (Ω.cm) | Magnetic permeability at 50 MHz |
|---|---|---|---|---|---|---|---|
| | | $Fe_2O_3$ | NiO | ZnO | MnO | | |
| M - 1 | 1 | 52.0 | — | 25.0 | 23.0 | 1 | 20 |
| N - 1 | 10 | 54.5 | 25.1 | 20.4 | — | 5 | 20 |
| N - 1 | 50 | 52.9 | 25.1 | 22.0 | — | 10 | 45 |
| N - 2 | 10 | 53.7 | 24.6 | 21.7 | — | 8 | 45 |
| N - 2 | 50 | 53.0 | 25.4 | 21.6 | — | 10 | 50 |
| N - 2 | 100 | 52.9 | 25.9 | 21.1 | — | 20 | 70 |
| N - 3 | 100 | 52.3 | 25.8 | 21.8 | — | 80 | 75 |
| N - 4 | 100 | 51.9 | 25.3 | 22.8 | — | 100 | 80 |
| N - 5 | 100 | 51.4 | 25.2 | 23.4 | — | 150 | 80 |
| N - 6 | 100 | 50.7 | 23.5 | 23.9 | 1.8 | 300 | 90 |
| N - 7 | 100 | 50.4 | 22.2 | 24.2 | 3.2 | 500 | 105 |
| N - 8 | 100 | 49.4 | 19.6 | 25.1 | 5.9 | >10³ | 92 |
| N - 9 | 50 | 49.8 | 18.1 | 24.6 | 7.5 | >10³ | 85 |
| N - 9 | 100 | 49.3 | 18.6 | 25.1 | 7.0 | >10³ | 80 |
| N - 10 | 1 | 49.7 | 15.8 | 22.9 | 11.6 | >10³ | 70 |
| N - 10 | 10 | 47.4 | 15.9 | 25.0 | 11.7 | >10³ | 80 |
| N - 10 | 50 | 45.4 | 14.7 | 26.7 | 13.1 | >10³ | 60 |
| N - 11 | 1 | 49.8 | 11.1 | 25.1 | 14.0 | 100 | 20 |
| N - 12 | 1 | 49.7 | 9.1 | 25.2 | 16.0 | 100 | 20 |

Figure 4:
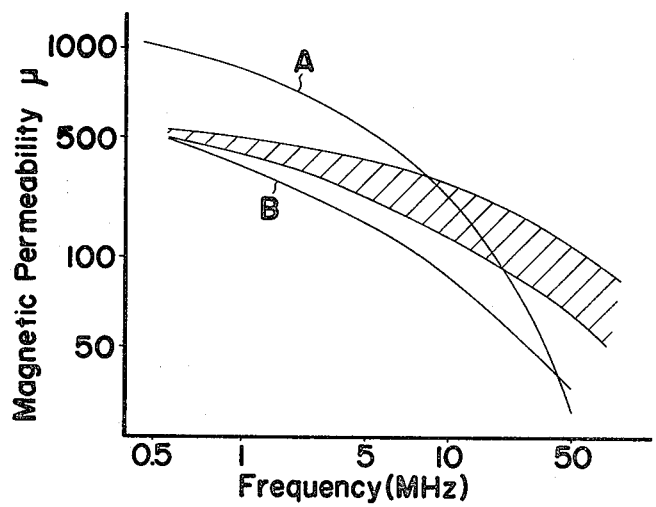
FIG. 4 is a diagram showing frequency characteristics, which exhibits effects of the replacement with MnO.

It is apparent from Table 3 that magnetic properties in the high frequency region can be improved remarkably by the replacement with MnO. Single crystals N-1 through N-5 which were free of MnO had a low magnetic permeability at 50 MHz and a poor specific resistance. In the compositions in these embodiments, specific resistance becomes excellent (i.e. higher than $10^3$ Ω-cm) if the MnO content is more than 6 molar %. Particularly in samples having an MnO content of 8–12 molar %, there is an optimum oxygen partial pressure under which magnetic permeability at 50 MHz becomes maximum in the low oxygen partial pressure range of 1–100 Kg/cm². The optimum oxygen partial pressure becomes lower as the amount of MnO added is increased. If oxygen partial pressure is kept constant, magnetic permeability at 50 MHz is inclined to be reduced when MnO content is excessive as in Samples N-11 and N-12. FIG. 4 shows models indicating that frequency characteristics are considerably increased by the replacement with MnO. In FIG. 4, "A" is a characteristic curve of Mn-Zn ferrite single crystal which indicates that magnetic permeability is reduced remarkably as frequency becomes high, while magnetic permeability at low frequency is high. "B" is a characteristic curve of Ni-Zn ferrite having a high $Fe^{2+}$ content. A region shown by oblique lines is the characteristic region of the Ni-Mn-Zn ferrite single crystals prepared according to the present invention, wherein the magnetic permeability is not greatly reduced in the high frequency region.

Though the present invention has been described with reference to Bridgman's method, the present invention is not limited thereto as described above. There may also be employed, for example, a floating zone method wherein a previously prepared polycrystalline rod used as starting material is arranged in an electric furnace to form a partially molten body and the molten part is gradually moved from the seed crystal body to form single crystal, taking advantage of viscosity of the molten body; or a drawing-up method wherein a crucible fixed in an electric furnace is filled with a melt, the melt is contacted with a seed crystal and it is drawn up under rotation to form a single crystal. According to the present invention, any of these methods wherein oxygen partial pressure elevation, is possible can be employed.

According to the process of the present invention for producing ferrite single crystal which is produced as described above, a ferrite single crystal for high frequency having magnetic properties equivalent or superior to those of Ni-Zn ferrite prepared under a high oxygen partial pressure in the prior art can be obtained under a low oxygen partial pressure. Therefore, various methods of growing single crystals can be employed. An apparatus used for the production is simple. The process has a high mass productivity. Ferrite single crystals of a high capacity can be supplied at low cost. Thus, various effects are obtained by the process of the present invention.

Although the present invention has been described with reference to the preferred embodiments of the invention, the applicants have found that any one of MgO, CdO and CuO may be employed in place of MnO. Further, growing rate in the range of 0.2 mm/hour to 5 mm/hour and crucible diameter in the range of 15 mm to 100 mm can be applied. Also, the growing temperature can be applied in the range of at least 1670° C. to 1740° C.

What is claimed is:

1. A process for producing Ni-Mn-Zn ferrite single crystal for high frequency wherein a sample comprising 10-30 molar percent of NiO, 1.8-12 molar percent of MnO, 15-35 molar percent of ZnO and 49-53 molar percent of $Fe_2O_3$ is melted and subjected to growing into a crystal under an oxygen partial pressure of below about 100 Kg/cm².

2. The process according to claim 1, in which the oxygen partial pressure is in the range of 0.2-100 Kg/cm².

3. The process according to claim 1, in which MnO is contained in the range of 8-12 molar percent.

4. The process according to claim 1, in which said sample is sintered provisionally at about 1,000° C. for two hours in air to form sample powders, said sample powders being kneaded, dried and shaped into tablets under a pressure of about 1 ton/cm², said tablets being sintered at about 1,200° C. for two hours in air, wherein said tablets are inserted into a crucible and melted under the conditions of growing temperature of about 1670°-1740° C., growing rate of about 2 mm/hour and crucible diameter of about 15 mm to 100 mm.

* * * * *